(12) United States Patent
Tomizawa et al.

(10) Patent No.: US 11,309,203 B2
(45) Date of Patent: Apr. 19, 2022

(54) WAFER STAGE AND METHOD OF MANUFACTURING THE SAME

(71) Applicant: SAMSUNG ELECTRONICS CO., LTD., Suwon-si (KR)

(72) Inventors: Kazuyuki Tomizawa, Yokohama (JP); Masashi Kikuchi, Yokohama (JP); Michio Ishikawa, Yokohama (JP); Takafumi Noguchi, Yokohama (JP); Kazuhiro Yamamuro, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 477 days.

(21) Appl. No.: 16/458,264

(22) Filed: Jul. 1, 2019

(65) Prior Publication Data

US 2020/0152499 A1 May 14, 2020

(51) Int. Cl.
| | | |
|---|---|---|
| *H01T 23/00* | (2006.01) | |
| *H01L 21/683* | (2006.01) | |
| *F25B 21/02* | (2006.01) | |
| *H01L 21/67* | (2006.01) | |
| *H01L 35/30* | (2006.01) | |

(52) U.S. Cl.
CPC .......... *H01L 21/6833* (2013.01); *F25B 21/02* (2013.01); *H01L 21/67103* (2013.01); *H01L 35/30* (2013.01)

(58) Field of Classification Search
None
See application file for complete search history.

(56) References Cited

U.S. PATENT DOCUMENTS

| | | | |
|---|---|---|---|
| 6,310,755 B1 | 10/2001 | Kholodenko et al. | |
| 6,462,928 B1 | 10/2002 | Shamouilian et al. | |
| 6,490,146 B2 | 12/2002 | Wang et al. | |
| 7,547,407 B2* | 6/2009 | Matsuda ............... | C04B 35/111 264/619 |
| 2002/0036881 A1 | 3/2002 | Shamouilian et al. | |

(Continued)

FOREIGN PATENT DOCUMENTS

| | | |
|---|---|---|
| JP | 2001-102436 | 4/2001 |
| JP | 2013-102135 | 5/2013 |
| JP | 2015-008287 | 1/2015 |

*Primary Examiner* — Stephen W Jackson
(74) *Attorney, Agent, or Firm* — F. Chau & Associates, LLC

(57) ABSTRACT

A wafer stage includes an electrostatic chuck (ESC) plate, an upper supporting plate, a lower supporting plate and a temperature controller. The ESC plate includes a first surface that supports a wafer. The upper supporting plate is bonded to a second surface of the ESC plate opposite to the first surface. The lower supporting plate overlaps the upper supporting plate. The temperature controller is disposed between the upper supporting plate and the lower supporting plate. The ESC plate includes ceramics. The upper supporting plate includes a composite material of aluminum or aluminum alloy and ceramics or carbon. The ESC plate and the upper supporting plate are directly bonded to each other by a room temperature solid bonding process. Thus, the wafer stage has sufficient strength to withstand pressure differences between a vacuum and atmospheric pressure, improved temperature response by minimizing heat capacity, and prevents warpage of the ESC plate.

20 Claims, 3 Drawing Sheets

(56) References Cited

U.S. PATENT DOCUMENTS

| | | |
|---|---|---|
| 2013/0098068 A1 | 4/2013 | Takahashi et al. |
| 2014/0356985 A1 | 12/2014 | Ricci et al. |
| 2017/0110298 A1 | 4/2017 | Ricci et al. |
| 2017/0256432 A1* | 9/2017 | Burmeister ............. H01L 21/82 |
| 2019/0276366 A1* | 9/2019 | Sun ................... H01J 37/32724 |
| 2020/0234992 A1* | 7/2020 | Hoescheler ......... H01L 21/6833 |

* cited by examiner

WAFER STAGE AND METHOD OF MANUFACTURING THE SAME

CROSS-RELATED APPLICATION

This application claims priority under 35 USC § 119 from, and the benefit of, Japanese Patent Application No. 2018-212815, filed on Nov. 13, 2018 in the Korean Intellectual Property Office (KIPO), and Korean Patent Application No. 10-2018-0170782, filed on Dec. 27, 2018 in the Korean Intellectual Property Office (KIPO), the contents of both of which are herein incorporated by reference in their entireties.

BACKGROUND

1. Technical Field

Exemplary embodiments are directed to a wafer stage and a method of manufacturing the same. More particularly, exemplary embodiments are directed to a wafer stage that can receive a wafer, and a method of manufacturing the wafer stage.

2. Discussion of the Related Art

In processes for manufacturing a semiconductor device using an apparatus, temperature dependency of any one of the processes, for example, an etching process, can increase due to a fine pitch of a pattern, an aspect ratio, etc., of the semiconductor. Thus, a margin of temperature control in the processes decreases. In particular, the temperature may need to be carefully controlled in the processes.

SUMMARY

Exemplary embodiments provide a wafer stage that has sufficient strength to withstand the pressure difference between a vacuum and atmospheric pressure, improved temperature control by minimizing the heat capacity, and prevents warpage of the electrostatic chuck plate.

Exemplary embodiments also provide a method of manufacturing the above-mentioned wafer stage.

According to exemplary embodiments, there is provided a wafer stage. The wafer stage may include an electrostatic chuck (ESC) plate, an upper supporting plate, a lower supporting plate and a temperature controller. The ESC plate includes a first surface that supports a wafer. The upper supporting plate is bonded to a second surface of the ESC plate opposite to the first surface. The lower supporting plate overlaps the upper supporting plate. The temperature controller is disposed between the upper supporting plate and the lower supporting plate. The ESC plate includes ceramics. The upper supporting plate includes a composite material of aluminum or aluminum alloy and ceramics or carbon. The ESC plate and the upper supporting plate are directly bonded to each other by a room temperature solid bonding process.

According to exemplary embodiments, there is provided a method of manufacturing a wafer stage. The wafer stage includes an electrostatic chuck (ESC) plate, an upper supporting plate, a lower supporting plate and a temperature controller. The ESC plate includes a first surface that supports a wafer. The upper supporting plate is bonded to a second surface of the ESC plate opposite to the first surface. The lower supporting plate overlaps the upper supporting plate. The temperature controller is disposed between the upper supporting plate and the lower supporting plate. The ESC plate includes ceramics. The upper supporting plate includes a composite material of aluminum or aluminum alloy and ceramics or carbon. The method of manufacturing the wafer stage includes forming a middle layer between the ESC plate and the upper supporting plate, and directly bonding the ESC plate to the upper supporting plate using a room temperature solid bonding process.

According to exemplary embodiments, there is provided a wafer stage that includes an electrostatic chuck (ESC) plate, an upper supporting plate, a lower supporting plate, a Peltier element, and a flexible thermal conductive sheet. The electrostatic chuck (ESC) plate includes a first surface on which a wafer is placed. The upper supporting plate is bonded to a second surface of the ESC plate opposite to the first surface. The lower supporting plate overlaps the upper supporting plate. The Peltier element is disposed between the upper supporting plate and the lower supporting plate. The flexible thermal conductive sheet is disposed between the Peltier element and the upper supporting plate. The ESC plate and the upper supporting plate are directly bonded to each other by a room temperature solid bonding process.

According to exemplary embodiments, the wafer stage may have the sufficient strength for withstanding the pressure difference between the vacuum and the atmospheric pressure, the improved temperature responsibility by minimizing the heat capacity, and the warpage prevention of the ESC plate.

DETAILED DESCRIPTION OF THE EMBODIMENTS

Hereinafter, exemplary embodiments will be explained in detail with reference to the accompanying drawings.

Figure 1:
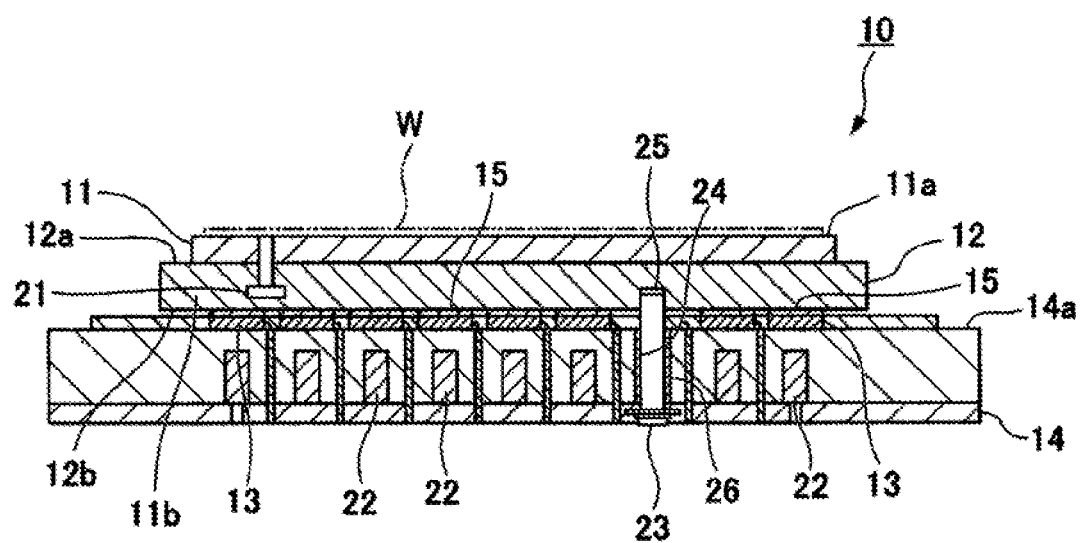
FIG. 1 is a cross-sectional view of a wafer stage in accordance with exemplary embodiments.
Figure 2:
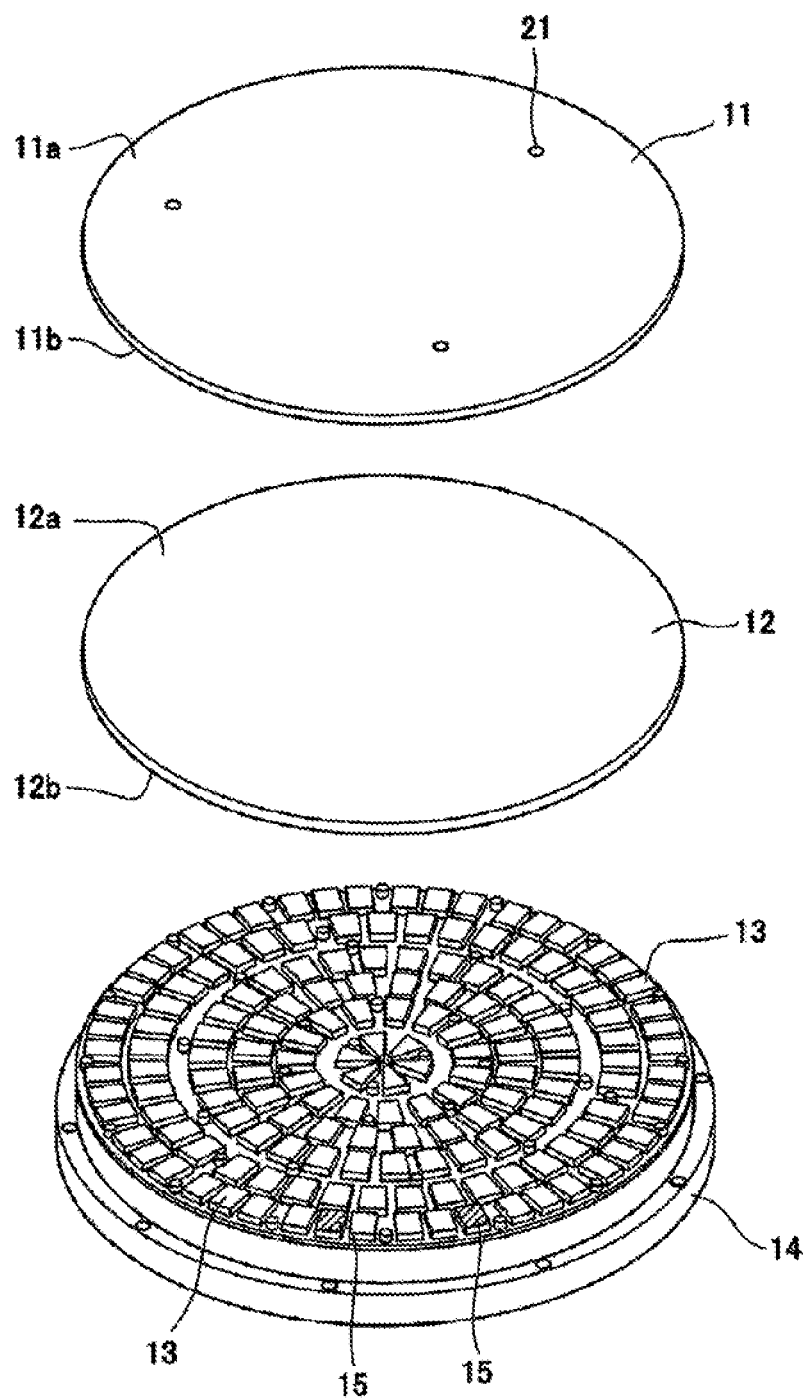
FIG. 2 is an exploded perspective view of a wafer stage in FIG. 1.

FIG. 1 is a cross-sectional view of a wafer stage in accordance with exemplary embodiments, and FIG. 2 is an exploded perspective view of a wafer stage in FIG. 1.

Referring to FIGS. 1 and 2, according to an embodiment, a wafer stage 10 includes an ESC plate 11, an upper supporting plate 12, a Peltier element 13 and a lower supporting plate 14. The lower supporting plate 14, the Peltier element 13, the upper supporting plate 12 and the ESC plate 11 are sequentially stacked. The Peltier element 13 functions as a temperature controller. A thermal conductive sheet 15 is disposed between the Peltier element 13 and the upper supporting plate 12.

According to an embodiment, when the wafer stage 10 is used, a wafer W, such as a silicon wafer, is placed on a first surface 11a of the ESC plate 11. In exemplary embodiments, the first surface 11a of the ESC plate 11 corresponds to an upper surface of the ESC plate 11. The ESC plate 11 includes ceramics. For example, the ESC plate 11 includes at least one of SiC, alumina ($Al_2O_3$) or AlN.

In exemplary embodiments, the ESC plate 11 includes a composite material of alumina and SiC. The ESC plate 11 may be a Johnson Rahbeck (JR) force type, a Coulomb force type, etc. An internal electrode that generates an electrostatic force is formed in the ESC plate 11. A voltage of about ±100V~about 500V is applied to the internal electrode of a JR force type ESC plate. A voltage of about ±1,000V~about 8,000V is applied to the internal electrode of a Coulomb force type ESC plate.

According to an embodiment, a thermal conductive gas passageway 21 is formed in the ESC plate 11. A thermal conductive gas such as helium, which has a high thermal conductivity [0.1442 W/mk (0° C.)], is supplied to the first surface 11a of the ESC plate 11 through the thermal conductive gas passageway 21 so that heat from the Peltier element 13 is effectively transferred between the wafer W and the first surface 11a of the ESC plate 11.

According to an embodiment, when the wafer stage 10 is installed in a semiconductor fabrication apparatus, the upper supporting plate 12 is disposed at a boundary between a vacuum environment in a vacuum chamber of the semiconductor fabrication apparatus and an atmospheric environment of other regions of the semiconductor fabrication apparatus. The upper supporting plate 12 has a first surface 12a that corresponds to the vacuum environment and a second surface 12b that corresponds to the atmospheric environment. The first surface 12a corresponds to an upper surface of the upper supporting plate 12. The second surface 12b corresponds to a lower surface of the upper supporting plate 12. Thus, the upper supporting plate 12 has a material and thickness that is pressure resistant with respect to a pressure difference of about at least 1 atmospheric pressure.

According to an embodiment, the upper supporting plate 12 includes a composite material of aluminum or aluminum alloy and ceramics or carbon. For example, the ceramics include at least one of SiC, alumina ($Al_2O_3$) or AlN.

According to an embodiment, the upper supporting plate 12 has a composition ratio that has a thermal expansion coefficient of no greater than about ±5% with respect to the ESC plate 11. In exemplary embodiments, the upper supporting plate 12 includes a metal matrix composite (MMC) of about 29% Al and about 71% SiC. The MMC has an electric resistance substantially the same as that of Al. The MMC has a thermal expansion coefficient substantially similar to that of the material of the ESC 11, such as the composite material of alumina and SiC. Therefore, warpage or delamination caused by a thermal expansion difference is prevented between the upper supporting plate 12 and the ESC plate 11 bonded to each other.

According to an embodiment, the MMC in the upper supporting plate 12 is formed by a pressure infiltration process in which Al infiltrates into a SiC madreporite by a pressure or a vacuum infiltration process in which Al infiltrates into the SiC madreporite under vacuum. The MMC in the upper supporting plate 12 has a porosity of no more than about 1%. Further, gasses are not expelled from pores of the MMC by heating.

According to an embodiment, the first surface 12a of the upper supporting plate 12 is directly bonded to a second surface 11b of the ESC plate 11 opposite to the first surface 11a by a room temperature solid bonding process. When the upper supporting plate 12 and the ESC plate 11 are bonded to each other by a room temperature solid bonding process, a middle layer is disposed between the upper supporting plate 12 and the ESC plate 11. The upper supporting plate 12 and the ESC plate 11 are pressurized to each other to diffuse components into the middle layer, thereby directly bonding the upper supporting plate 12 and the ESC plate 11 to each other.

According to an embodiment, the middle layer used in the room temperature solid bonding process includes a metal that may have low self-activation energy and a high diffusion coefficient or an amorphous ceramics having good surface flatness. For example, the middle layer increases surface smoothness between the second surface 11b of the ESC plate 11, which has low surface smoothness due to the large grains of SiC, and the first surface 12a of the upper supporting plate 12 to promote the room temperature solid bonding process.

According to an embodiment, the middle layer used in the room temperature solid bonding process includes a metal layer that includes at least one of Al, Ti, Ni, Au, Ag, Cu, In or Sn, or an amorphous ceramics such as $SiO_2$, SiN, etc. In exemplary embodiments, when the upper supporting plate 12 and the ESC plate 11 are bonded to each other by a room temperature solid bonding process, an Al layer having a thickness of about 10 µm is formed on the first surface 12a of the upper supporting plate 12 to form a mirror surface. A pressure of about 200 kN is applied to the upper supporting plate 12 and the ESC plate 11 for about 2 hours under atmospheric pressure or a vacuum to bond the upper supporting plate 12 and the ESC plate 11 to each other.

According to an embodiment, before performing the room temperature solid bonding process, a mirror grinding is performed on the second surface 11b of the ESC plate 11. The Al layer on the first surface 12a of the upper supporting plate 12 is removed under a reduction atmosphere. Further, the middle layer includes a gradient material formed by mixing the material of the upper supporting plate 12 with alumina.

According to an embodiment, the middle layer includes at least two different layers that overlap each other. By using a multi-layered middle layer, a middle layer that has an optical material can be selected to smooth the second surface 12b of the upper supporting plate 12 and the first surface 11a of the ESC plate 11.

According to an embodiment, the Peltier element 13 includes a thermoelectric element that converts electric energy into thermal energy. When a potential difference is generated between electrodes at both ends of a thermoelectric element, a temperature difference is generated between both ends of the thermoelectric element. The Peltier element 13 can be classified into a uni-leg type Peltier element that includes thermoelectric elements with a same semiconductor type, or a π type Peltier element that includes an N type thermoelectric element and a P type thermoelectric element. In exemplary embodiments, the Peltier element 13 includes a π type Peltier element that effectively performs the thermoelectric conversion.

According to an embodiment, the plurality of the Peltier elements 13 are disposed between the upper supporting plate 12 and the lower supporting plate 14. In exemplary embodiments, about 150 to about 160 Peltier elements 13 that have a diameter on which a 300 mm diameter wafer W can be placed are provided in the wafer stage 10. For example, the Peltier elements 13 occupy an area of no less than about 45% of that of a first surface 14a in the lower supporting plate 14.

According to an embodiment, each of the Peltier elements 13 may provide the first surface 11a of the ESC plate 11 with a heat change rate in a temperature range from about 30° C. to about 80° C. of no less than about 1° C./s and a cooling rate of no less than about 0.6° C./s. The temperature of the wafer W on the ESC plate 11 can be rapidly controlled without a time-lag by using the Peltier elements 13.

According to an embodiment, each of the Peltier elements 13 includes a thermistor. The 150~160 Peltier elements are independently controlled. When the wafer W on the ESC plate 11 has a diameter of about 300 mm, each 20 mm×20 mm region on the wafer W can be accurately heated or cooled. Further, the wafer W is provided with a uniform temperature without a temperature gradient. Furthermore, a temperature of each of the regions on the wafer W can be independently changed.

In exemplary embodiments, the temperature controller includes the Peltier element 13 but is not restricted to specific elements. For example, a plurality of thin heaters can be disposed on a lower supporting plate 14 that has a cooling passageway. The first surface 11a of the ESC plate 11 is heated by the thin heaters. In contrast, a cooling agent can be supplied to the lower supporting plate 14 through the cooling passageway to stop the thin heaters from dissipating heat.

According to an embodiment, a thermal conductive sheet 15 is disposed between the Peltier element 13 and the upper supporting plate 12. For example, the thermal conductive sheet 15 includes a flexible sheet material, such as a silicon sheet, that has a thermal conductivity of no less than about 1 w/mK. The silicon sheet is formed by adding carbon to silicon to improve the thermal conductivity. The silicon sheet has an optimal concentration of carbon that improves the thermal conductivity and decreases flexibility of silicon caused by the added carbon. The thermal conductive sheet 15 has hardness of no more than Asker C20. The thermal conductive sheet IS has a thickness of about 0.3 mm to about 1.0 mm in the absence of a load.

According to an embodiment, the thermal conductive sheet 15 is vertically compressed between the Peltier element 13 and the upper supporting plate 12 by using a screw 23 to combine the upper supporting plate 12 with the lower supporting plate 14. The thermal conductive sheet 15 decreases thermal contact resistance between the Peltier element 13 and the upper supporting plate 12. The thermal conductive sheet 15 may absorb displacement of the upper supporting plate 12 caused by thermal deformation of the upper supporting plate 12 to stably transfer heat between the Peltier element 13 and the wafer W.

According to an embodiment, the lower supporting plate 14 has a first surface 14a that makes contact with the Peltier element 13. The first surface 14a of the lower supporting plate 14 corresponds to an upper surface of the lower supporting plate 14. The lower supporting plate 14 supports the Peltier element 13 and the upper supporting plate 12. The lower supporting plate 14 includes a material having a Young's Modulus of no less than about 120 MPa. A material that has a Young's Modulus of no less than about 120 MPa increases the strength of the lower supporting plate 14. Further, a material that has a Young's Modulus of no less than about 120 MPa prevents warpage of the lower supporting plate 14 caused by a pressure difference between atmospheric pressure and the vacuum.

According to an embodiment, the lower supporting plate 14 includes a material that has at least one of Ti, Ti alloy, carbon, Si, SiC, $Al_2O_3$, BN or $ZrO_2$. In exemplary embodiments, the lower supporting plate 14 includes an MMC that is about 29% Al and about 71% SiC. The Al is A6061.

According to an embodiment, the MMC in the lower supporting plate 14 is formed by a pressure infiltration process in which Al infiltrates into a SiC madreporite by a pressure or a vacuum infiltration process in which Al infiltrates into the SiC madreporite under vacuum. The MMC in the lower supporting plate 14 has a porosity of no more than about 1%. Further, gasses are not expelled from pores of the MMC by heating.

According to an embodiment, a plurality of cooling passageways 22 may be formed in the lower supporting plate 14. A cooling agent flows through the cooling passageways 22. To form a cooling passageway 22, the lower supporting plate 14 is vertically divided into first and second plates. A plurality of grooves may be formed at the first plate. The first plate that has the grooves is bonded to the second plate to form the lower supporting plate 14 with the cooling passageways 22.

According to an embodiment, the cooling agent includes refrigerants such as organic refrigerants such as Freon, water, etc. The cooling agent is circulated through a radiator. When the Peltier elements 13 cool the wafer W, the cooling agent flows through the cooling passageway 22 in the lower supporting plate 14 to rapidly absorb heat in the lower supporting plate 14 and prevent the Peltier elements 13 from overheating. Thus, the Peltier elements 13 can effectively cool the wafer W.

According to an embodiment, the upper supporting plate 12 and the lower supporting plate 14 are combined with each other using the screw 23. The screw 23 is inserted into a screw hole 24 that penetrates through the lower supporting plate 14. The screw 23 threadedly combines with a threaded portion 25 that vertically extends from the second surface 12b of the upper supporting plate 12. Thus, the Peltier elements 13 between the upper supporting plate 12 and the lower supporting plate 14 are fixed by the screw 23.

According to an embodiment, to prevent an abnormal discharge from being generated between the upper supporting plate 12 and the lower supporting plate 14 caused by an RF current, atmospheric pressure is applied between the upper supporting plate 12 and the lower supporting plate 14. To ensure pressure resistivity between the atmospheric environment between the upper supporting plate 12 and the lower supporting plate 14, and the vacuum environment at the ESC plate 11, about 30~40 screws 23 separated by uniform intervals are disposed between the upper supporting plate 12 and the lower supporting plate 14.

According to an embodiment, a spacer 26 is placed around each screw 23. The spacer 26 uniformly maintains a gap between the upper supporting plate 12 and the lower supporting plate 14. Thus, although the screws 23 may have different fixing pressures, the gap between the upper supporting plate 12 and the lower supporting plate 14 is maintained by the spacer 26. Further, deviations of the thermal conductivities of the Peltier elements 13 can be prevented.

According to an embodiment, a release-preventing member is provided with each of the screws 23. The release-preventing member prevents a release of the screw 23 to provide a uniform fixing pressure to the upper supporting plate 12 and the lower supporting plate 14, which can prevent deviations in the thermal conductivities of the Peltier elements 13.

According to an embodiment, a total value of a heat capacity from the second surface 12b of the upper supporting plate 12 to the first surface 11a of the ESC plate 11 of the wafer stage 10 is no more than about 3.0 J/K per unit area. By maintaining a total heat capacity value of no more than about 3.0 J/K, the heat in the Peltier elements 13 can be rapidly transferred to the first surface 11a of the ESC plate 11. As a result, the temperature of the wafer stage 10 can be accurately controlled in accordance with temperature changes of the wafer W.

According to exemplary embodiments, the upper supporting plate 12 includes a composite material comprised of aluminum or an aluminum alloy or ceramics or carbon to provide a wafer stage with a sufficient strength to endure pressure difference between an atmospheric environment and a vacuum environment.

Further, according to an embodiment, the ESC plate 11 and the upper supporting plate 12 are directly bonded to each other by a room temperature solid bonding process. Thus, the thermal conductivity and the temperature response between the ESC plate 11 and the upper supporting plate 12 are improved as compared to using an adhesive between the ESC plate 11 and the upper supporting plate 12. Further, by directly bonding the ESC plate 11 to the upper supporting plate 12, the bonding strength between the ESC plate 11 and the upper supporting plate 12 is reinforced and warpage of the ESC plate 11 caused by thermal expansion can be prevented. As a result, the wafer stage 10 can firmly fix the wafer W.

According to an embodiment, a semiconductor fabrication apparatus that processes a wafer W on the wafer stage 10 includes an etching apparatus, a CVD apparatus, a sputtering apparatus, etc. By incorporating the wafer stage 10 into a semiconductor fabrication apparatus, a semiconductor fabrication apparatus can be implemented with the wafer stage 10 that has sufficient strength to endure pressure differences and improved temperature response without warpage of the ESC plate 11 caused by thermal expansion. When using a corrosive gas in the etching apparatus or the CVD apparatus, a corrosion-resistive layer such as alumina, yttrium oxide, etc., is coated on the wafer stage 10.

Figure 3:
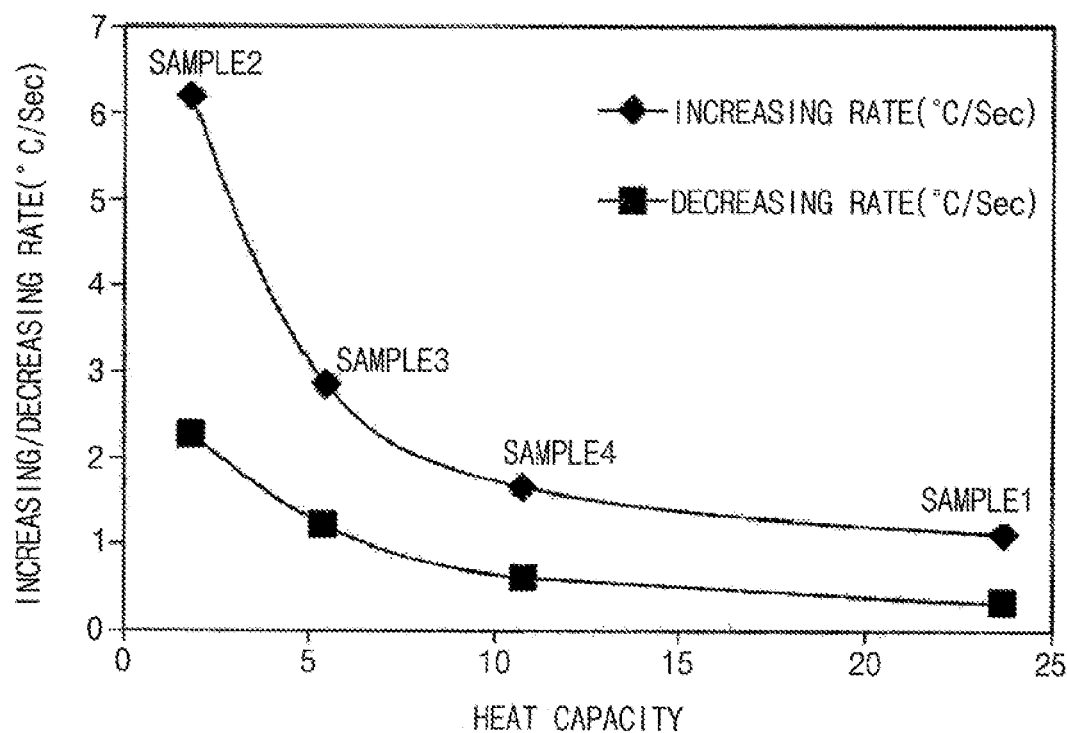
FIG. 3 is a graph showing increasing/decreasing temperature change rates in the wafer stage with respect to heat capacity of an upper supporting plate and an ESC plate.

According to embodiments, the increasing and decreasing rates of temperature change in the wafer stage have been verified. The increasing and decreasing temperature change rates were dependent on the driving capacity of the Peltier element and the thermal conductivity and the heat capacity of the upper supporting plate and the ESC plate. Thus, a sample 1 of the upper supporting plate of SUS304 having a thickness of about 6 mm, a sample 2 of the MMC having a thickness of about 1 mm, a sample 3 of the MMC having a thickness of about 3 mm, and a sample 4 of the MMC having a thickness of about 6 mm were prepared. The increasing and decreasing temperature change rates with respect to the samples 1 to 4 were measured. Temperature change rates on the first surface of the ESC plate between 30° C. to 80° C. under a condition that the temperature of the lower supporting plate was fixed to 50° C. were measured and measured results were shown in FIG. 3.

Figure 4:
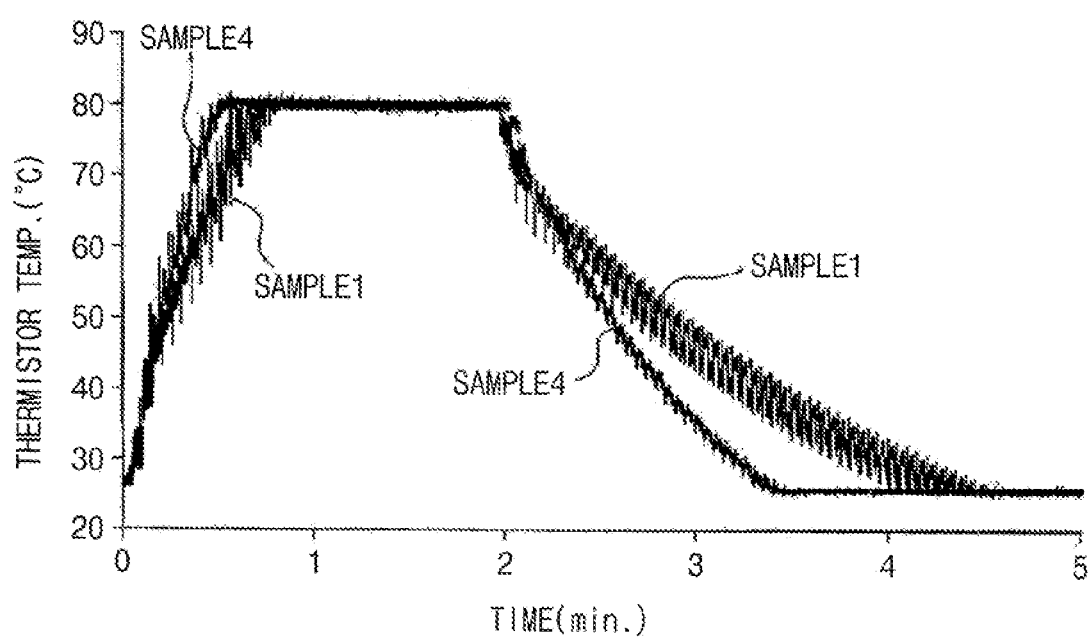
FIG. 4 is a graph showing thermistor temperatures with respect to time.

The Peltier element was a 72 series produced by Ferrotec Corporation. A maximum value of a driving power in the Peltier element was 4.3V and 3 A per unit. Because a cooling rate of no less than about 1° C./sec was required in view of a process, the total value of the heat capacity of the upper supporting plate and the ESC plate per unit area was no more than about 6.0J/K. FIG. 4 shows measured increasing and decreasing temperatures of the samples 1 and 4. As shown in FIG. 4, alumina having a thickness of about 1 mm was formed on the MMC of an ESC plate having a thickness of about 3 mm by a solid diffusion bonding process to manufacture a wafer stage having desired characteristics.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from novel teachings and advantages of the present invention. Accordingly, all such modifications are intended to be included within the scope of the present invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A wafer stage comprising:
    an electrostatic chuck (ESC) plate that includes a first surface on which a wafer is placed;
    an upper supporting plate bonded to a second surface of the ESC plate opposite to the first surface;
    a lower supporting plate that overlaps the upper supporting plate; and
    a temperature controller disposed between the upper supporting plate and the lower supporting plate,
    wherein the ESC plate comprises a material that includes ceramics, the upper supporting plate comprises a composite material of aluminum or aluminum alloy and ceramics or carbon, and the ESC plate and the upper supporting plate are directly bonded to each other by a room temperature solid bonding process.

2. The wafer stage of claim 1, wherein the ceramics comprises at least one of SiC, $Al_2O_3$ or AlN.

3. The wafer stage of claim 1, wherein the composite material of the upper supporting plate has a porosity of no more than 1%.

4. The wafer stage of claim 1, wherein the upper supporting plate has a thermal expansion coefficient of no greater than ±5% of that of the ESC plate.

5. The wafer stage of claim 1, wherein the temperature controller comprises a Peltier element.

6. The wafer stage of claim 5, wherein the Peltier element comprises a plurality of elements, and each of the Peltier elements is independently controlled.

7. The wafer stage of claim 5, wherein the Peltier element occupies an area of no less than about 45% of an area of a first surface of the lower supporting plate.

8. The wafer stage of claim 5, wherein the Peltier element provides the first surface of the ESC plate with a heat change rate of no less than 1° C./sec in a temperature range from 30° C. to 80° C. and a cooling change rate of no less than 0.6° C./sec.

9. The wafer stage of claim 5, further comprising a flexible thermal conductive sheet disposed between the Peltier element and the upper supporting plate.

10. The wafer stage of claim 9, wherein the thermal conductive sheet has a thermal conductivity of no less than about 1 w/mK.

11. The wafer stage of claim 9, wherein the thermal conductive sheet has a thickness from 0.3 mm to 1.0 mm, absent a load to the thermal conductive sheet.

12. The wafer stage of claim 9, wherein the thermal conductive sheet has hardness of no more than Asker C20.

13. The wafer stage of claim 1, wherein the lower supporting plate has a cooling passageway through which a cooling agent flows.

14. The wafer stage of claim 1, wherein the lower supporting plate includes a material that has a Young's Modulus of no less than about 120 MPa.

15. The wafer stage of claim 14, wherein the lower supporting plate comprises at least one of Ti, Ti alloy, carbon, Si, SiC, $Al_2O_3$, BN or $ZrO_2$.

16. The wafer stage of claim 1, wherein a total value of a heat capacity from a second surface of the upper supporting plate that faces the temperature controller to the first surface of the ESC plate is no more than 3.0 J/K per unit area.

17. The wafer stage of claim 1, further comprising:
a screw that combines the upper supporting plate with the lower supporting plate using a screw;
a spacer disposed around the screw to uniformly maintain a gap between the upper supporting plate and the lower supporting plate; and
a release-preventing member provided with the screw.

18. A method of manufacturing a wafer stage, the wafer stage being an electrostatic chuck (ESC) plate that includes a first surface on which a wafer is placed, an upper supporting plate bonded to a second surface of the ESC plate opposite to the first surface, a lower supporting plate that overlaps the upper supporting plate, and a temperature controller disposed between the upper supporting plate and the lower supporting plate, wherein the ESC plate comprises a material that includes ceramics, and the upper supporting plate comprises a composite material of aluminum or aluminum alloy and ceramics or carbon, the method comprising:
forming a middle layer between the ESC plate and the upper supporting plate; and
directly bonding the ESC plate to the upper supporting plate using the middle layer by using a room temperature solid bonding process.

19. The method of claim 18, wherein the middle layer comprises at least one of Al, Ti, Ni, Au, Ag, Cu, In, Sn, Si or $SiO_2$.

20. A wafer stage comprising:
an electrostatic chuck (ESC) plate that includes a first surface on which a wafer is placed;
an upper supporting plate bonded to a second surface of the ESC plate opposite to the first surface;
a lower supporting plate that overlaps the upper supporting plate;
a Peltier element disposed between the upper supporting plate and the lower supporting plate; and
a flexible thermal conductive sheet disposed between the Peltier element and the upper supporting plate,
wherein the ESC plate and the upper supporting plate are directly bonded to each other by a room temperature solid bonding process.

* * * * *